United States Patent [19]

Fushii et al.

[11] Patent Number: 5,354,415
[45] Date of Patent: Oct. 11, 1994

[54] METHOD FOR FORMING A CERAMIC CIRCUIT BOARD

[75] Inventors: Yasuhito Fushii; Miyuki Nakamura; Yukihiko Nakajima, all of Omuta; Kazuo Kato, Machida; Akira Miyai, Machida; Kazuyuki Hiruta, Machida, all of Japan

[73] Assignee: Denki Kagaku Kogyo Kabushiki Kaisha, Tokyo, Japan

[21] Appl. No.: 584

[22] Filed: Jan. 4, 1993

Related U.S. Application Data

[63] Continuation of Ser. No. 778,211, Dec. 16, 1991, abandoned.

[30] Foreign Application Priority Data

Apr. 16, 1990 [JP] Japan ................................. 2-97523

[51] Int. Cl.⁵ .............................................. C23F 1/00
[52] U.S. Cl. .................... 156/630; 156/634; 156/656; 156/664
[58] Field of Search ............... 156/630, 634, 656, 664, 156/645, 901; 427/123, 125, 96, 126.2

[56] References Cited

U.S. PATENT DOCUMENTS

| | | | |
|---|---|---|---|
| 4,227,039 | 10/1980 | Shibasaki et al. | 156/630 X |
| 4,435,611 | 3/1984 | Ohsawa et al. | 174/68.5 |
| 4,647,477 | 3/1987 | DeLuca | 156/667 X |
| 4,712,161 | 12/1987 | Pryor et al. | 361/411 |
| 5,019,187 | 5/1991 | Iyogi et al. | 148/24 |
| 5,025,116 | 6/1991 | Kawakami et al. | 174/250 |
| 5,036,167 | 7/1991 | Kasai | 174/256 |
| 5,058,799 | 10/1991 | Zsamboky | 156/667 X |
| 5,110,384 | 5/1992 | Dudek et al. | 427/203 X |
| 5,240,551 | 8/1993 | Matsumura et al. | 156/630 |

FOREIGN PATENT DOCUMENTS

| | | |
|---|---|---|
| 0115158 | 8/1984 | European Pat. Off. . |
| 0153618 | 9/1985 | European Pat. Off. . |
| 1508179 | 4/1975 | Japan . |
| 51-3101 | 1/1976 | Japan . |
| 54-103568 | 8/1979 | Japan . |
| 55-41744 | 3/1980 | Japan . |
| 57-50490 | 3/1982 | Japan . |
| 25815955 | 3/1983 | Japan . |
| 59-229892 | 12/1984 | Japan . |
| 60-195068 | 10/1985 | Japan . |
| 61-42192 | 2/1986 | Japan . |
| 61-82493 | 4/1986 | Japan . |
| 61-121489 | 6/1986 | Japan . |
| 61-158423 | 10/1986 | Japan . |
| 62-151581 | 7/1987 | Japan . |
| 62-264689 | 11/1987 | Japan . |
| 63-160393 | 7/1988 | Japan . |
| 63-169348 | 7/1988 | Japan . |
| 64-24078 | 1/1989 | Japan . |
| 64-42370 | 2/1989 | Japan . |
| 64-54798 | 3/1989 | Japan . |
| 1313968 | 12/1989 | Japan . |

OTHER PUBLICATIONS

Patent Abstracts of Japan, vol. 13, No. 551 (E-857)(3899), Dec. 8, 1989, JP-A-12 30 290, Sep. 13, 1989.

*Primary Examiner*—Thi Dang
*Attorney, Agent, or Firm*—Oblon, Spivak, McClelland, Maier & Neustadt

[57] ABSTRACT

Method for forming a ceramic circuit board by forming a metal circuit pattern on a ceramic board through an active metal ingredient-containing brazing material and removing an unnecessary part of the brazing material by chemical liquor treatment.

25 Claims, 4 Drawing Sheets

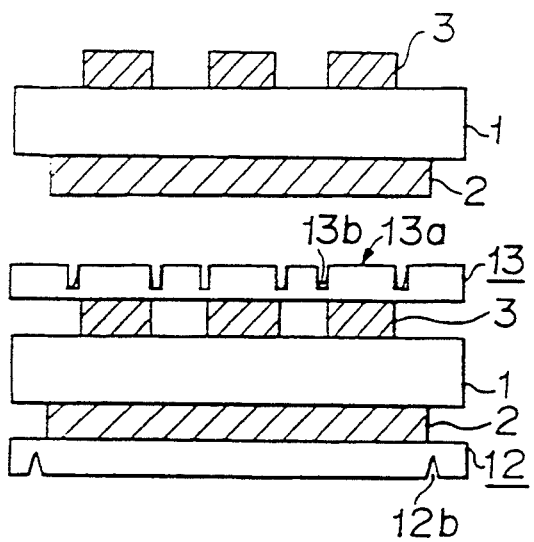
FIG. 3(a)
FIG. 3(b)
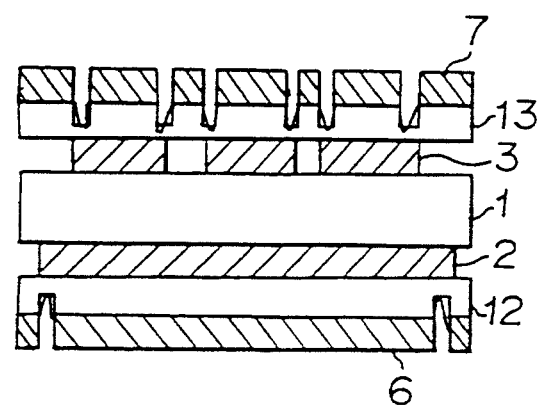
FIG. 3(c)
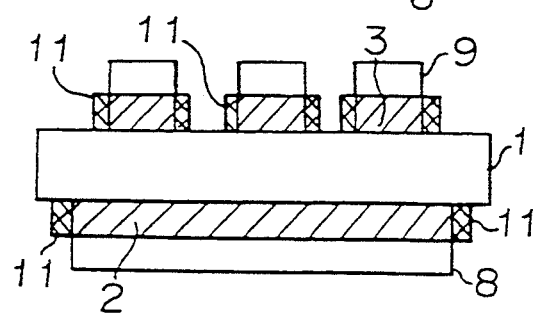
FIG. 3(d)
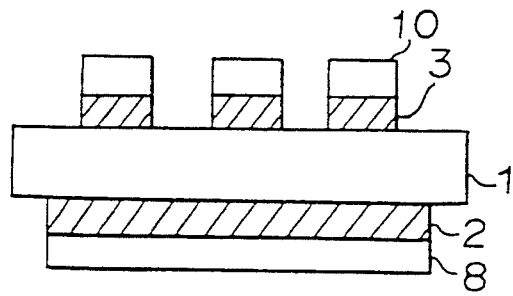
FIG. 3(e)

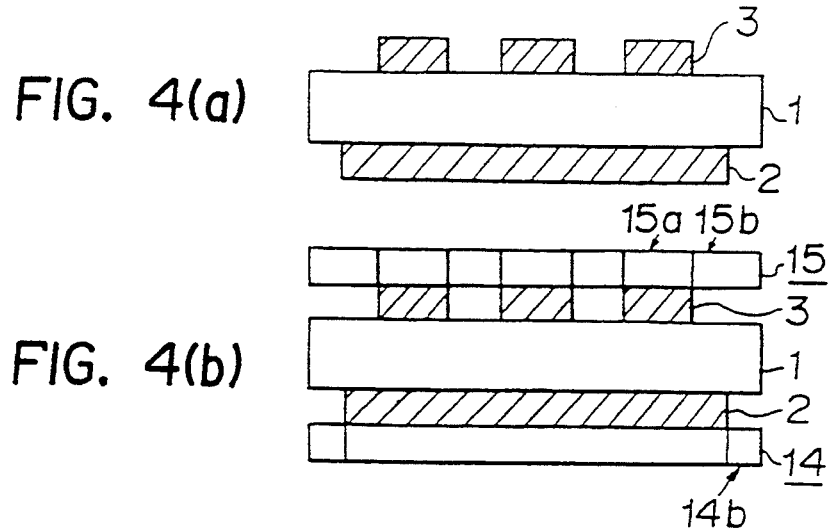
FIG. 4(a)
FIG. 4(b)
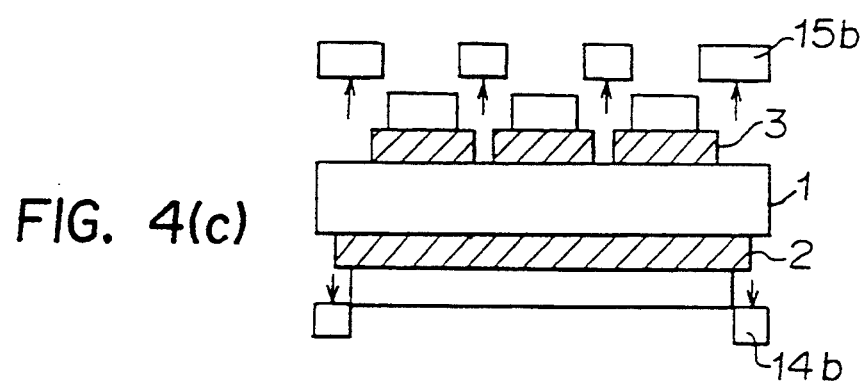
FIG. 4(c)
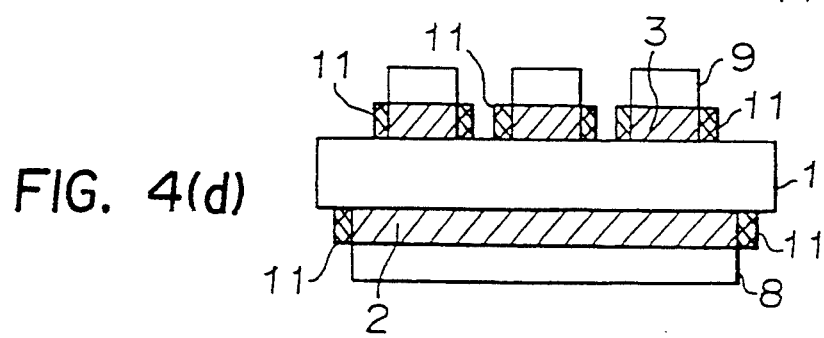
FIG. 4(d)
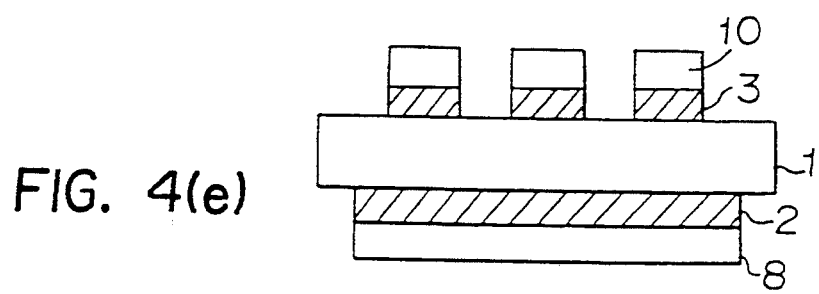
FIG. 4(e)

METHOD FOR FORMING A CERAMIC CIRCUIT BOARD

This application is a continuation of application Ser. No. 07/778,211, filed on Dec. 16, 1991, now abandoned.

FIELD OF THE INVENTION

The present invention relates to a method for forming a ceramic circuit board comprising a metal circuit on a ceramic board.

DESCRIPTION OF THE PRIOR ART

Recently, large power modules including large-power and high-efficient invertors have been changed in accordance with improvements on industrial apparatuses such as robot, motors, and heat generated from semiconductor elements steadily increases. In order to efficiently radiate this heat, various steps have been conventionally applied on high power module boards. Particularly, a ceramic board having a good heat conductivity has been recently developed, and there is employed a structure prepared by bonding a metal plate on a substrate board, forming a metal circuit and placing a semiconductor element on the metal plate.

Heretofore, various methods have been proposed to bond metals and ceramics. Particularly, in the preparation of circuit boards, there have been proposed Mo-Mn method, an active metal brazing method, a copper sulfide method, a DBC method as defined below, a copper metallizing method and the like. Among these methods, in the preparation of a large power module board, copper is used as a metal, and a active metal brazing method or a DBC method is mainly used at present to bond with ceramics. Further, aluminum nitride having a high thermal conductivity is prevalently used as a ceramic board.

Heretofore, as the method for bonding a copper plate and an aluminum nitride board, there are known an active metal brazing method wherein a copper plate and an aluminum nitride board are bonded to each other by having a brazing material containing an active metal ingredient (hereinafter simply referred to as "brazing material") placed between the copper plate and the aluminum nitride board and subjecting them to heat treatment (see for example Japanese Unexamined Patent Publication No. 177634/1985) and a DBC method wherein a copper plate and an aluminum nitride board having the surface oxidized are bonded to each other by heating at a temperature of not higher than the melting point of copper but higher than the eutectic temperature of $Cu_2O-O$ (see for example Japanese Unexamined Patent Publication No. 163093/1981). As compared with the DBC method, the active metal brazing method has the advantages of (1) the residual stress caused by thermal expansion difference of AlN-Cu being small since the treating temperature to obtain the above-mentioned bonded product is low, and (2) being highly resistant to heat shock and heat cycle since a copper plate is a ductile metal, but has a disadvantage that, unlike the DBC method, it is difficult to bond a metal plate (e.g. a copper plate) on the whole surface and to etch for forming a circuit, thus the productivity being poor. This is because, according to the active metal brazing method, the bonding mechanism between the copper plate and the aluminum nitride board, particularly the bonding form between the brazing material and the aluminum nitride board is not satisfactory. Thus, according to the active metal brazing method, bonding is effected by reacting the aluminum nitride board with active metal ingredients such as a titanium (Ti) ingredient, a zirconium (Zr) ingredient and a hafnium (Hf) ingredient one-sidedly present on the aluminum nitride board side during heat treatment to form a nitride layer. However, in such a method which comprises coating a brazing material on the whole surface of an aluminum nitride board, having the coated board contacted with a copper plate, heat-treating to obtain a bonded product and etching the resultant product to form a copper circuit, it is difficult to remove the nitride layer of active metals formed between copper circuit (metal circuit) patterns by etching with a usual etching solution such as a ferric chloride solution and a cuptic chloride solution, thus the productivity being poor. Therefore, heretofore, a brazing material paste was not coated on the whole surface of a ceramic board. The above-mentioned nitride layer of active metals must have been removed since it caused a short-circuit between copper circuit patterns.

Accordingly, heretofore, the above-mentioned brazing material paste was coated in a copper circuit pattern, and a copper plate having the same shape as the circuit pattern was then placed thereon and heat-bonded. However, according to this conventional method, the brazing material ingredient was protruded out of the copper circuit pattern, and the protruded brazing material caused a short-circuit. Therefore, the protruded part was heretofore removed by a physical step such as sandblast, thus the productivity being very poor.

Hereinbefore, various problems in the bonding of a copper plate and an aluminum nitride board by the active metal brazing method have been explained, but similar problems were raised also in the case of bonding other metal plates than a copper plate, e.g. a nickel plate or a copper alloy plate, with other ceramic boards than an aluminum nitride board, e.g. an alumina board, a silicon nitride board and a mullite board. For example, in the case of using a Ti ingredient as an active metal ingredient and an alumina board as a ceramic board, there was a problem that a Ti-Al type alloy was formed on the outside of the metal circuit pattern.

SUMMARY OF THE INVENTION

In order to solve the above mentioned problems, the present inventors have made various studies and found that not only the above-mentioned advantages of the active metal brazing method can be maintained but also the productivity can be improved in the same manner as in the DBC method, i.e. a method for producing a ceramic circuit board which comprises bonding a metal plate on the whole surface of a ceramic board and then etching, can be achieved by forming a metal circuit pattern on a ceramic board through a brazing material and removing unnecessary brazing materials such as a brazing material protruded out of the metal circuit pattern and a brazing material present between the metal circuit patterns with a chemical liquor. The present invention has been completed on the basis of this discovery.

The present inventors have further found and completed the present invention that the productivity can be remarkably improved also in the conventional method which comprises coating (printing) a brazing material paste in the same pattern as a metal circuit pattern, bonding a metal plate sufficiently wide to cover the circuit pattern and finally etching to form the metal circuit pattern and also in the method which comprises bonding the below-mentioned push back metal plate on a ceramic board and then removing an unnecessary metal part of the push back metal plate to form a metal circuit pattern.

Thus, the essential feature of the present invention resides in a ceramic circuit-board characterized by being obtained by forming a metal circuit pattern on a ceramic board through a brazing material and then removing an unnecessary part of brazing material by chemical liquor treatment.

Hereinafter, the present invention is explained in more detail.

The most important essential feature of the present invention is to form a ceramic circuit board having a metal circuit by forming a metal circuit pattern on a ceramic board and then removing an unnecessary part of brazing material by chemical liquor treatment. Accordingly, the present invention provides a method having a great advantage which can not be attained by the conventional method, in respect that a metal circuit can be formed even by coating a brazing material on the whole surface of a ceramic board. The reason that a paste-like brazing material heretofore could not be coated on the whole surface of a ceramic board, resulted in the reaction product of the ceramics and the brazing material in the bonding of a metal plate and a ceramic board, as mentioned above.

Explanation About a Ceramic Board Used in the Present Invention

The material of a ceramic board used in the present invention comprises at least one or two or more members selected from the group consisting of aluminum nitride (AlN), silicon nitride (Si3N4), aluminum oxide (Al2O3) and mullite as the main components.

An aluminum nitride board prepared by the known method can be suitably used, examples of which include one prepared by sintering by hot press method without adding any sintering aid, and one prepared by adding a sintering aid such as IIIa metal oxides, rare earth element oxides and alkali earth metal oxides including yttrium oxide, cerium oxide, samarium oxide, calcium oxide and magnesium oxide, to aluminum nitride powder, shaping the resultant mixture and pressure-less sintering.

A silicon nitride board prepared by the known method can be suitably used, examples of which include one prepared by adding a sintering aid of at least one member selected from oxides and nitrides of Mg, Al, Y, Sc, La, Ce, Be and Zr, to silicon nitride powder, shaping the resultant mixture and hot pressing or sintering under normal pressure.

An aluminum oxide board preferably contains Al2O3 in an amount of from 90 to 99.5% by weight, and is prepared by adding SiO2, CaO, MgO, BaO, clay, talc, feldspar or the like as a subcomponent to aluminum oxide powder, shaping the resultant mixture and hot pressing or sintering under normal pressure.

A mullite board prepared by the known method can be suitably used, examples of which include one prepared by adding alumina, clay, talc, feldspar or the like thereto, and sintering the shaped mixture.

Explanation About a Brazing Material Used in the Present Invention

Metal ingredients for a brazing material used in the present invention include one or two or more members of active metal ingredients such as a Ti ingredient, a Zr ingredient and an Hf ingredient, and one or two or more members of metal ingredients other than the active metal ingredients, such as a copper (Cu) ingredient and a nickel (Ni) ingredient. In order to lower the melting point of a brazing material, a silver (Ag) ingredient may further be incorporated therein.

In the present invention, most preferable metal ingredients other than active metal ingredients comprise a combination of an Ag ingredient and a Cu ingredient having a composition of from 60 to 85% by weight of Ag ingredient and from 40 to 15% by weight of Cu ingredient, and the eutectic composition or its close composition, i.e. a composition of 72% by weight of Ag ingredient and 28% by weight of Cu ingredient, is particularly preferable in respect of lowering a heat treatment temperature and increasing a bonding strength.

The form of a brazing material used in the present invention is a paste or a foil.

The paste comprises the above-mentioned metal ingredients and an organic solvent, and may further contain an organic binder for easy handling. The metal ingredients are provided in an appropriate form selected from the group of metal powder, alloy powder and compounds. Concrete examples for a combination of the metal ingredients include Ag-Cu-Ti, Ag-Cu-Zr, Ag-Cu-Hf, Ag-Cu-TiH$_2$, Cu-Ti, Cu-Zr, Ni-Ti, Ni-Zr, Ni-ZrH$_2$, Ni-TiH$_2$, Cu-TiH$_2$, Ag-Cu-Zr-Ti and Ag-Cu-Zr-TiH$_2$. However, in the case of compounds of active metal ingredients, they must decompose at a temperature of below the bonding temperature, and active metals such as Ti, Zr and Hf must be separated alone.

The paste used in the present invention in further contains sub-ingredients, together with the above metal ingredients, examples of which include one or two or more ceramic powders selected from the group consisting of AlN, Si$_3$N$_4$, Al$_2$O$_3$, and boron nitride (BN). A paste containing such a ceramic powder hardly produces an unnecessary part of a brazing material when coated in a metal circuit pattern. This is probably because the ceramic powder consumes an excess amount of active metal ingredients, thereby preventing an excessive wetting with a ceramic board, and consequently the formation of the unnecessary brazing material (reaction product layer) in the outside of the metal circuit pattern can be prevented.

The thickness of a coated paste is generally from 10 to 40 μm, and accordingly, the maximum diameter of the ceramic powder should not exceed 50 μm, preferably not larger than 30 μm, particularly not larger than 20 μm. Also, the average particle size should not be so large as to badly affect the bonding state since an amount of the ceramic powder to be added becomes too large when its average particle size is too large, and accordingly, the average particle size should preferably be not larger than 15 μm, more preferably not lager than 10 μm, particularly not larger than 5 μm.

A brazing material paste containing the above-mentioned metal ingredients and optionally containing ceramic powders is prepared by mixing with an organic solvent or a combination of an organic solvent and an organic binder by means of a mixer such as a roll, a kneader, a Bumbury's mixer, a universal mixer and a mortar. Examples of the organic solvent used include methyl cellosolve, ethyl cellosolve, terpinenol, isophorone and toluene, and examples of the organic binder used include ethyl cellulose, methyl cellulose, polymethylmethacrylate (PMMA) and polyisobutylmethacrylate (PIBMA).

The brazing material paste ingredients are used in the following weight ratios, i.e. from 3 to 40 parts by weight of an active metal ingredient, from 0 to 10 parts by weight, preferably from 1 to 9 parts by weight, more preferably from 2 to 8 parts by weight (from 5 to 35 parts by weight smaller, particularly from 10 to 30 parts by weight smaller than the amount of the active metal ingredient used) of a ceramic powder, from 10 to 30 parts by weight of an organic solvent and from 0 to 5 parts by weight of an organic binder, to 100 parts by weight of a metal ingredient other than the active metal ingredient. The viscosity of the brazing material paste is preferably from 1,000 to 20,000 cps.

Hereinafter, a brazing material foil is explained.

As metal ingredients for the brazing material, an active metal foil and a metal foil other than the active metal foil as explained with regard to the above paste can be used as they are, and they are provided in the form of an alloy foil containing an active metal ingredient and a metal ingredient other than the active metal ingredient or a laminated product of an active metal foil and a metal foil other than the active metal foil.

In the case of using an alloy foil, concrete combination examples of metal ingredients include Ag-Cu-Ti, Af-Cu-Zr Ag-Cu-Hf, Cu-Ti, Cu-Zr, Ni-Ti, Ni-Zr and Ag-Cu-Zr-Ti. Among them, Ag-Cu-Zr or Ag-Cu-Zr-Ti is preferable. In the Ag-Cu-Zr system alloy, the Zr ingredient is preferably from 4 to 35 parts by weight, more preferably from 10 to 30 parts by weight to the total 100 parts by weight of the Ag ingredient and the Cu ingredient. On the other hand, in the Ag-Cu-Zr-Ti system alloy, to the total 100 parts by weight of the Ag ingredient and the Cu ingredient, the Zr ingredient is preferably from 2 to 25 parts by weight, more preferably from 3 to 20 parts by weight, and the Ti ingredient is preferably from 1 to 25 parts by weight, more preferably from 2 to 20 parts by weight. The total amount of the Zr ingredient and the Ti ingredient should preferably be not more than 35 parts by weight.

In the case of using a laminated product, examples of the lamination order of an active metal foil and a metal foil other than the active metal foil include an example of laminating first a Zr foil and then an Ag-Cu alloy foil on a ceramic board, an example of laminating first a Zr foil, secondly a Ti foil and then an Ag-Cu alloy foil on a ceramic board, and an example of laminating first a Ti foil, a Zr foil and then an Ag-Cu alloy foil on a ceramic board. In such case, the thickness of each metal foil is adjusted in such a manner so as to provide the above mentioned ingredient ratios when they are melted and alloyed. Examples of an active metal foil used include a Ti foil, a Zr foil, an Hf foil and their alloy foil, and examples of a meta foil other than the active metal include a Cu foil, an Ni foil or its alloy foil and an alloy foil further containing Ag.

Explanation About a Metal Plate Used in the Present Invention

The material of a metal plate used in the present invention is not specially limited but is generally copper, nickel, a copper alloy or a nickel alloy. Also, its thickness is not specially limited, but is generally from 0.1 to 1.0 mm, preferably from 0.2 to 0.5 mm, and a metal plate having a thickness similar to that of generally referred to as a metal foil can be used. The shape of the metal used has the following three types.

① For examples, metal plates 4, 5 (hereinafter referred to as "solid metal plate") involving at least a metal circuit pattern 9 and having an area wider than that as illustrated by FIGS. 1(b) and 2(b)

In the case of using a solid metal plate, a paste-like or foil-like brazing material involves at least a metal circuit pattern 9, and is disposed on a ceramic board in an area wider than that. Thus, the brazing material can be disposed on the whole surface of the ceramic board, and can also be disposed in the same pattern as the metal circuit pattern 9.

② Metal plates 12, 13 (hereinafter referred to as "half-etched metal plate") comprising a metal circuit part 13a and parts 12b, 13b other than the metal circuit part having a thickness smaller than the metal circuit part The parts (thinner parts) 12b, 13b other than the metal circuit are preferably formed by dissolving by chemical etching process, and a brazing material is preferably disposed in the same pattern as the metal circuit pattern 9.

The use of a half-etched metal plate provides the following advantages.

i) When a metal circuit pattern is formed by etching, the etching resist can be coated by a simple and high productive method using a roll coater and the like.

ii) The etching resist can be coated on the whole surface of a ceramic board by screen printing.

iii) During etching process, since the etching resist is not coated on the part (thinner part) other than the metal circuit of a half-etched metal plate, the metal circuit part and the part other the metal circuit can be easily separated from each other.

iv) An unnecessary brazing material protruded outside from a metal circuit pattern can be easily removed by chemical liquor treatment after etching.

③ Metal plates 14, 15 (hereinafter referred to as "push back metal plate") comprising a metal circuit part 15a and parts 14b, 15b other than the metal circuit in such a state as to be easily separated by applying mechanical force as illustrated by FIG. 4(b)

A push back metal plate can be prepared, for example, in the following manner.

i) A metal circuit part is pulled out from a metal plate and is inserted again to restore the original state.

ii) A groove is provided to the state just before a metal circuit part is slipped out.

iii) In the above ii), the major part of the groove is passed through to separate the major parts of the metal circuit part and the part other than the metal circuit.

In the above processes i) to iii), the thicknesses of the metal circuit part and the part other than the metal circuit may be the same or different from each other. The metal circuit parts may be formed by means of a press mold, a shaping machine, a milling cutter or the like, or by chemical etching.

In the case of using a push back metal plate, a brazing material should preferably be disposed in the same pattern as a metal circuit pattern, and the metal circuit pattern can be easily formed by bonding a push back metal plate with a ceramic board and then separating the metal part other than the metal circuit. An unnecessary brazing material protruded outside from the metal circuit pattern is removed by chemical liquor treatment.

Explanation About an Etching Solution Used in the Present Invention

A metal circuit pattern is formed by bonding a metal plate with a ceramic board, coating an etching resist on the metal plate and then etching. When using a push back metal plate, this process is not necessary.

Examples of the etching resist used in the present invention include an ultraviolet ray-curable type or heat-curable type resist. Examples of an etching solution include a ferric chloride solution, a cupric chloride solution, a sulfuric acid and a hydrogen peroxide solution when a metal plate is a copper plate or a copper alloy plate. Among them, a preferable etching solution is a ferric chloride solution or a cupric chloride solution. On the other hand, when a metal plate is nickel or a nickel alloy, a ferric chloride solution is generally used.

Explanation About a Chemical Liquor Used in the Present Invention to Remove an Unnecessary Brazing Material "Unnecessary brazing material" in the present invention means a brazing material present between metal circuit patterns. Such an unnecessary brazing material is a brazing material originally present between metal circuit patterns (this is produced when a brazing material is disposed on the whole surface of a ceramic board) or a brazing material protruded between metal circuit patterns when bonding a metal plate. The ingredients of the unnecessary brazing material include not only ingredients present at the time of preparing the brazing material but also a nitride layer produced by reaction of an active metal ingredient of the brazing material and ceramics or an alloy layer produced by reaction of metal and ceramics.

Examples of a chemical liquor used in the present invention to remove the unnecessary brazing material include hydrofluoric acid alone, a mixed acid of hydrofluoric acid with an inorganic acid such as nitric acid, sulfuric acid or hydrochloric acid, aqua regia, a sodium hydroxide solution and a potassium hydroxide solution, and are appropriately selected depending on the ingredients of the unnecessary brazing material. A preferable chemical liquor is hydrofluoric acid alone or a mixed acid of hydrofluoric acid and hydrochloric acid. In the case of hydrofluoric acid alone, a preferable concentration is from 2 to 55% by weight, and a mixed acid preferably comprises form 2 to 40% by weight of hydrofluoric acid and from 1 to 15% by weight of an inorganic acid such as hydrochloric acid.

The unnecessary brazing material is removed by dipping a bonded product of a metal plate and a ceramic board in the chemical liquor or by spraying the chemical liquor on the above bonded product like a shower. In this case, one kind of a chemical liquor may be used alone, or many kinds of chemical liquors may be used alternatively. The temperature of the chemical liquor is preferably raised to generally from 40° to 95° C. when used.

The most preferable method comprises applying ultrasonic wave at the same time as the chemical liquor treatment and/or in the washing step using water, a solvent, an alkaline degreased liquor or the like after the chemical liquor treatment, thereby enabling the time required for removing unnecessary brazing material shorter.

Explanation About Preferable Combinations of Materials Used in the Present Invention Preferable combinations of materials of the present invention when a ceramic circuit board is used, for example, as a power semiconductor module board are illustrated hereinafter.

Ceramic board: aluminum nitride board

Metal plate: copper plate

Brazing material paste: Ag-Cu-Zr system Ag-Cu-Zr-TiH$_2$ system Ag-Cu-TiH$_2$AlN system Method for removing unnecessary brazing material: hydrofluoric acid or a mixed acid is used as a chemical liquor and ultrasonic vibration is applied.

In the present invention, the reason why an aluminum nitride board is particularly preferable, is that it has a high thermal conductivity and a thermal expansion coefficient similar to those of silicon, and the reason why a copper plate is particularly preferable, is that it has an excellent electrical conductivity.

Furthermore, in the present invention, the reasons why the above mentioned three kinds of brazing material paste are preferable, are explained hereinafter.

① Ag-Cu-Zr System

As compared with the case of using a Ti ingredient, particularly TiH$_2$, as an active metal ingredient, this brazing material is somewhat poor in the bonding strength of a copper plate and an aluminum nitride board, but has a satisfactory practical strength. The productivity is very high since the removability of the unnecessary brazing material with the above mentioned chemical liquor is remarkably excellent. The wetting property between a copper plate and a brazing material is also excellent. The amount of the Zr ingredient used is preferably from 4 to 35 parts by weight, more preferably from 10 to 30 parts by weight to 100 parts by weight in total of the Ag ingredient and the Cu ingredient.

② Ag-Cu-Zr-TiH$_2$ System

This brazing material provides both advantages at the same time, i.e. an advantage of having a good wetting property between a copper plate and a brazing material, which is the merit of Zr, and an advantage of having a good bonding strength between a copper plate and an aluminum nitride board, which is the merit of Ti.

The amounts of the Zr ingredient and TiH$_2$ used are determined depending on the bonding strength and the easiness of the removability of an unnecessary brazing material. To 100 parts by weight in total of the Ag ingredient and the Cu ingredient, the Zr ingredient is preferably is used in an amount of from 2 to 25 parts by weight, more preferably from 3 to 20 parts by weight, and TiH$_2$ is preferably used in an amount of from 1 to 25 parts by weight, more preferably from 2 to 20 parts by weight, the total amount of the two being preferably not more than 35 parts by weight.

③ Ag-Cu-TiH$_2$-AlN System

This brazing material provides a satisfactory bonding strength between a copper plate and an aluminum nitride board, and the protrusion of the brazing material paste between metal circuit patterns hardly occurs.

To 100 parts by weight in total of the Ag ingredient and the Cu ingredient, TiH$_2$ is used in an amount of from 5 to 30 parts by weight and AlN is used in an amount of from 0.5 to 10 parts by weight. AlN is used preferably in proportion to the amount of TiH$_2$.

With regard to the ratio of the Ag ingredient and the Cu ingredient in the above brazing materials ① to ③, as mentioned above, the Ag ingredient is from 60 to 85% by weight, and the Cu ingredient is from 40 to 15% by weight. Particularly, the eutectic composition of 72% by weight of Ag ingredient and 28% by weight of Cu ingredient or its close composition is preferable.

The economical merit of the present invention is high since the ceramic circuit board of the present invention has various excellent properties and it can be prepared by a highly productive method of using a solid metal plate in the same manner as in the DBC method without losing the advantage of the active metal brazing method.

BRIEF DESCRIPTION OF THE DRAWINGS

The present invention is illustrated with reference to the drawings taking a power semiconductor module board as an example.

FIGS. 1(a)–(e), 2(a)–(e), 3(a)–(e) and FIG. 4(a)–(e), respectively illustrate process steps of embodiments for preparing the ceramic circuit board of the present invention.

FIGS. 1 and 2 illustrate an example of using a solid metal plate as a metal plate, and FIG. 3 illustrates an example of using a half-etched metal plate, FIG. 4 illustrating an example of using a push back metal plate.

BEST MODE FOR CARRYING OUT THE INVENTION

Brazing Material-disposing Step

In this step, brazing materials 2 and 3 are disposed on a ceramic board 1. When the brazing material is a paste, examples of a disposing method include a screen printing method and a roll coater method, but the later method is preferable in respect of productivity when the paste is coated on the whole surface of the board. On the other hand, when the brazing material is a foil, the above-mentioned alloy foil or laminated product is disposed as it is.

In order to prepare a power semiconductor module board, the brazing material 2 is disposed on almost whole surface of one side of the ceramic board 1. This is necessary for bonding a metal plate having almost the same size as the ceramic board and for brazing a heat sink material.

Figure 1A:
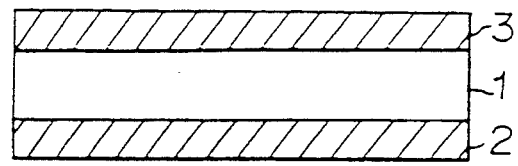
Figure 2A:
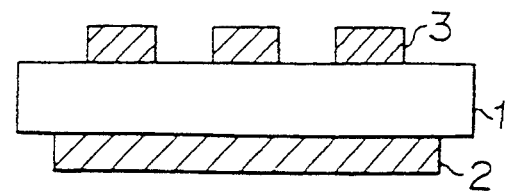

In order to form a metal circuit 10 for loading a semiconductor element thereon, the other side of the ceramic board is coated with the brazing material 3 in substantially whole area (FIG. 1a), or in the same pattern as the metal circuit (hereinafter referred to as "bonding pattern A") or in partly the same pattern as a part of the metal circuit (hereinafter referred to as "bonding pattern B") (FIG. 2a, FIG. 3a and FIG. 4a illustrate bonding pattern A).

In the case of bonding pattern A, a metal circuit 10 having the same shape as that is formed, and in the case of bonding pattern B, a metal circuit containing bonding pattern B but also having a non-bonding part different from bonding pattern B is formed.

The amount of the brazing material used is not specially limited, but is preferably from 5 to 15 mg/cm² on dry weight basis so as not to cause protrusion of the brazing material and poor bonding. This is because the protrusion can be removed with a chemical liquor after bonding.

Metal Plate-bonding Step

In the above brazing material-disposing step, a solid metal plate 4 having an area sufficient to cover the brazing material, i.e. having the same size or larger than the ceramic board, is disposed on the brazing material-disposed surface corresponding to substantially the whole area of the ceramic board. On the other hand, a solid metal plate 5 of the same size is disposed on the other side of the ceramic board to form a metal circuit 10 (FIG. 1b, FIG. 2b), but in the example of FIG. 2 it is not always necessary to use a solid metal plate but only to use a metal plate having an area sufficient to cover bonding pattern A or bonding pattern B or having an area larger than bonding pattern A or bonding pattern B. At any event, a copper plate used as a metal plate should preferably be a copper plate containing no oxygen.

On the other hand, FIG. 3b illustrates the disposition of half-etched metal plates 12, 13, and FIG. 4b illustrates the disposition of push back metal plates 14, 15. In these examples, processed metal plates such as a half-etched metal plate 12 and a push back metal plate 14 are disposed on the surface where the metal circuit 10 is not formed, but a solid metal plate may be used in place of these processed metal plates in the present invention.

The ceramic board having the metal plates disposed through the brazing material as mentioned above is heat-treated. Optimum conditions for the heat treating temperature vary depending on the types of a metal plate and a brazing material used, but the heat treating temperature must be below the melting point of the metal plate. For examples, in the case of a brazing material using Ag-Cu-active metal system as metal ingredients, the heat-treating temperature should preferably be at least 830° C., and in the case of a Cu-active metal system brazing material, the heat-treating temperature should preferably be at least 920° C., and in the case of an Ni-active metal system brazing material, the heat-treating temperature should preferably be at least 1,000° C.

The atmosphere for the heat treatment may be an inert gas atmosphere such as Ar or He, but a vacuum atmosphere is more preferable in respect of the wetting property of a brazing material.

A bonded product of a metal plate and a ceramic board can be obtained by cooling after heat treatment. Since difference in thermal expansion coefficients of the ceramic board and the metal plate is large, cracks and defects are sometimes caused in the bonded product due to residual stress when the cooling speed after heat treatment is large. Therefore, in the present invention, it is preferable to make the cooling speed not higher than 5° C./min, particularly not higher than 2° C./min, in order to reduce the residual stress as small as possible.

Metal Circuit Pattern-forming Step

In this step, a desired metal circuit pattern 9 is formed by using an etching resist 7. An etching resist 6 is necessarily for leaving a metal part 8 to solder a heat sink material, and the etching resist 7 is necessary for forming a metal circuit 10.

Figure 1B:
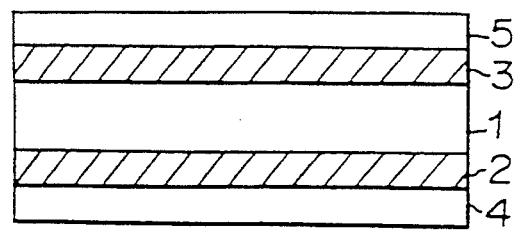
Figure 1C:
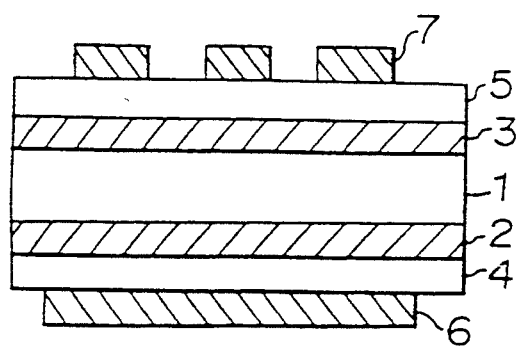

In the example of FIG. 1, the desired metal circuit pattern 9 may be formed by the etching resist 7 (FIG. 1C).

In the example of FIG. 2, it is important that the etching resist 7 should accurately correspond to the disposed position of a brazing material (bonding pattern A), and it is necessary to pay attention for making this accurate correspondence. Also, in FIG. 2, when the etching resist is formed in the same pattern as bonding pattern A (FIG. 2c), the bonding pattern A and the metal circuit are the same, but the present invention is not limited thereto. Although not shown in the Figures, a metal circuit having a shape different from bonding pattern B and also having a non-bonded part can be easily prepared by forming an etching resist to involve bonding pattern B and also to cover a metal plate part where a brazing material is not disposed. The merit of forming the non-bonded part as mentioned above, is that damages of a ceramic board caused by expansion-shrinkage of the metal part produced by heat cycle of electric conduction-suspension can be prevented by connecting an outer electrode with the non-bonded part when the outer electrode is connected with the metal circuit on the board. Also, in the case of DBC method, in order to form a non-bonded part, a metal plate must be specially processed in such a manner as not to bring a ceramic board in contact with a part of a metal plate corresponding to the non-bonded part, and it is necessary to dispose the metal plate accurately on the specified position. However, in the present invention, such a step is not necessary.

As shown in FIG. 3, when half-etched metal plates 12, 13 are used, an etching resist 7 is preferably coated by a roll coater. Because a thinner part 13b other than a metal circuit is not coated even when the etching resist is coated on the whole surface of the half-etched metal plate by the roll coater, and therefore the thinner part can be removed easily, thus raising productivity. Also, when a solid metal plate is disposed on the other side where a metal circuit is not formed, it is preferable to coat an etching resist on the same surface by screen printing.

As shown in FIG. 4, wherein push back metal plates 14, 15 are used, it is not necessary to coat an etching resist, except for a special case.

Figure 1D:
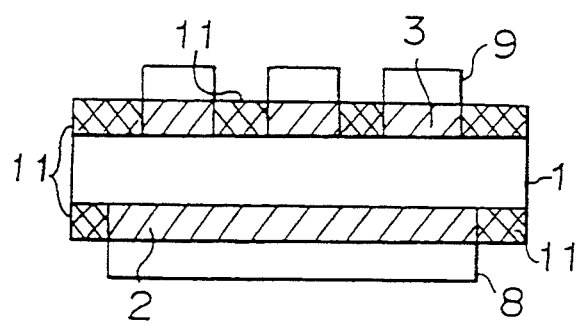
Figure 1E:
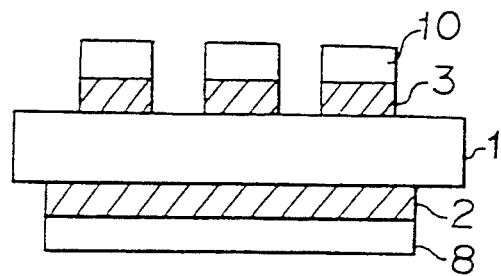
Figure 2B:
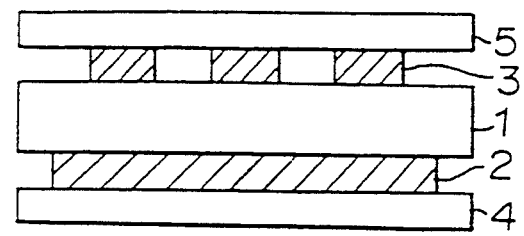
Figure 2C:
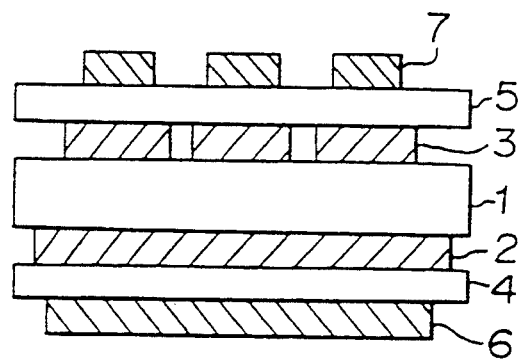
Figure 2D:
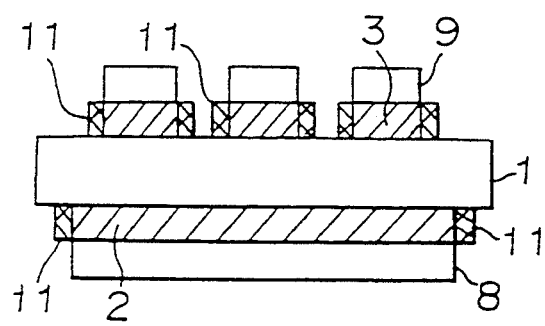
Figure 2E:
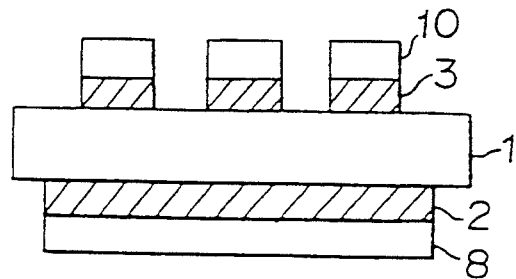

Thereafter, the unnecessary part of metal is removed by etching, and the etching resist film is separated to produce a ceramic board having a metal circuit pattern 9 (FIG. 1d, FIG. 2d, FIG. 3d). This separation step of the etching resist film is not always necessary when aqua regia is used as a chemical liquor in the succeeding unnecessary brazing material-removing step below mentioned. In FIG. 4, parts 14b, 15b other than metal circuits of push back metal plates 14, 15 are mechanically separated to produce a ceramic board having a metal circuit pattern 9 (FIGS. 4c, d).

This stage of the example of FIG. 1 is the state when unnecessary brazing materials 11 such as the originally disposed brazing material, its alloy layer and its nitride layer remain between metal circuit patterns 9.

In these stages of the examples of FIGS. 2 to 4, unnecessary brazing materials 11 protruded outside from metal circuit patterns 9 remain between metal circuit pattern 9.

Unnecessary Brazing Material-removing Step

The essential feature of the present invention resides in this step.

The ceramic boards obtained by the examples of FIGS. 2 to 3 have metal circuit patterns 9 at this stage, but sometimes have unnecessary brazing materials 11 protruded from metal circuit patterns 9 (FIG. 2d, FIG. 3d, FIG. 4d), which sometimes cause short-circuits. On the other hand, in the example of FIG. 1, unnecessary brazing materials 11, particularly conductive ingredients such as a metal layer containing a small amount of an active metal ingredient of the upper layer and an alloy layer-nitride layer containing a large amount of an active metal ingredient of the lower layer, remain between metal circuit-patterns 9 (FIG. 1d), and therefore these must be removed to form a metal circuit 10.

So, in the present invention, unnecessary brazing materials 11 present between metal circuit patterns 9 shown in FIG. 1d and unnecessary brazing materials 11 such as the protruded brazing materials shown in FIG. 2d, FIG. 3d and FIG. 4d, are removed by chemical liquor treatment to produce a ceramic circuit board having a metal circuit 10 of the present invention (FIG. 1e, FIG. 2e, FIG. 3e, FIG. 4e).

As a chemical liquor, those mentioned above can be used, and the treating time varies depending on the kind of the brazing materials and the type of a chemical liquor used. For example, when treating with 10% hydrofluoric acid at 80° C., the treating time is from 5 to 20 minutes for Ag-Cu-Zr system brazing material, from 10 to 30 minutes for Ag-Cu-Zr-TiH$_2$ system brazing material and from 10 to 30 minutes for Ag-Cu-TiH$_2$-AlN system brazing material.

It is effective to apply ultrasonic wave at the same time as the chemical liquor treatment and/or in the washing step after the chemical liquor treatment.

The present invention is further illustrated by the following Examples.

EXAMPLES 1-6

These Examples are carried out in accordance with the steps of FIG. 1a to FIG. 1e.

Three types of brazing material pastes were prepared by mixing 72 parts of silver powder, 28 parts of copper powder, 4 parts, 20 parts or 35 parts of metal zirconium powder and 15 parts of terpinenol in weight ratio.

Each of these pastes was coated on the whole surface of both sides of an aluminum nitride board of 60 mm×30 mm×0.65 mm$^t$ by a roll coater. The coated amount was 12.0 mg/cm$^2$ for the case of containing 4 parts of metal zirconium powder (Examples 1 and 2), 7.5 mg/cm$^2$ for the case of containing 20 parts of metal zirconium powder (Examples 3 and 4) and 5.5 mg/cm$^2$ for the case of containing 35 parts of metal zirconium powder (Examples 5 and 6) (FIG. 1a).

After drying the above brazing material paste-coated board, a solid copper plate of 60 mm×30 mm×0.25 mm$^t$ was disposed on both sides of the dried board in contact therewith, and was placed in a furnace to heat at 920° C. for 0.3 hour in a highly vacuumed atmosphere, thereafter cooling at a rate of 2° C./min to produce a bonded product. The samples thus obtained were respectively ten sheets (FIG. 1b).

Thereafter, a thermosetting etching resist was coated on the copper plate of each of these bonded products (FIG. 1c), and an unnecessary part of the copper plate was removed by etching with a ferric chloride solution, then the etching resist being separated (FIG. 1d).

The bonded products thus obtained still had unnecessary brazing materials remained between copper circuit patterns, and in order to remove the unnecessary brazing materials, five sheets each of the bonded products were treated with 10% hydrofluoric acid at 80° C. for 8 minutes in Example 1, for 12 minutes in Example 3 and for 14 minutes in Example 5.

The remaining five sheets each of the bonded products were treated in the same manner for 4 minutes in Example 2, for 6 minutes in Example 4 and for 7 minutes in Example 6, and ultrasonic wave was applied in the washing step.

With regard to the ceramic circuit boards thus obtained, in order to measure the peel strength of the copper circuit pattern and to confirm the presence of the brazing material between the copper circuit patterns, elemental analysis was carried out in the plane direction and in the cross-section direction between the patterns by means of EPMA (EMX-SM7 manufactured by Shimadzu Corp.).

These results are shown in Table 14.

EXAMPLES 7-11

These Examples were carried out in accordance with the steps of FIG. 1a to FIG. 1e.

A ceramic circuit board was prepared in the same manner as in Example 1 by using a paste comprising 72 parts of silver powder, 28 parts of copper powder, metal zirconium powder and titanium hydride powder (ratios shown in Table 1) in weight ratio, bonding a solid copper plate with an aluminum nitride board, etching to prepare a metal circuit and removing a brazing material between patterns under the conditions shown in Table 1.

TABLE 1

| Examples | Mixed amount (parts) | | Coated amount (mg/cm$^2$) | Bonding condition | Chemical liquor treatment | |
|---|---|---|---|---|---|---|
| | Zirconium | Titanium hydride | | | | |
| 7 | 2 | 25 | 6.0 | 880° C. 0.2 hr Cooling rate 2° C./min | Hydrofluoric acid (70° C., 15%), ultrasonic wave applied 10 minutes | → Hydrochloric acid (55° C., 10%) 15 minutes |
| 8 | 2 | 2 | 8.0 | | Hydrofluoric acid (70° C., 15%), ultrasonic wave applied 5 minutes | → Hydrochloric acid (55° C., 10%) 15 minutes |
| 9 | 25 | 1 | 7.5 | | Hydrofluoric acid (70° C., 5%), ultrasonic wave applied 5 minutes | → Hydrochloric acid (55° C., 10%) 15 minutes |
| 10 | 25 | 10 | 5.5 | | Hydrofluoric acid (70° C., 15%), ultrasonic wave applied 10 minutes | → Hydrochloric acid (55° C., 10%) 15 minutes |
| 11 | 13 | 5 | 8.0 | | Hydrofluoric acid (70° C., 15%), ultrasonic wave applied 5 minutes | → Hydrochloric acid (55° C., 10%) 15 minutes |

Note: When mixing a paste, 15 parts of terpinenol and 1 part of polyisobutylmethacrylate were added.

The values of evaluating the ceramic circuit boards thus obtained are shown in Table 14.

EXAMPLES 12-15

These Examples were carries out in accordance with the steps of FIG. 2a to FIG. 2e. A brazing paste was prepared by mixing 72 parts of silver powder, 28 parts of copper powder, titanium hydride powder and aluminum nitride powder in such a ratio as shown in Table 2 in weight ratio. This paste was coated on an aluminum nitride board by screen-printing in the same manner as in Example 1 in such a bonding pattern as shown in FIG. 2a. The amount of the paste coated is shown in Table 2.

After fully drying the paste-coated board, a copper plate of 60 mm×30 mm×0.30 mm$^t$ was disposed on both sides of the dried board in contact therewith, and was placed in a furnace.

This sample was heated at 900° C. for 0.5 hour in a highly vacuumed atmosphere, and was cooled at a cooling rate of 3° C./min to produce a bonded product (FIG. 2b).

Thereafter, a circuit pattern was formed on the copper plate of the bonded product by screen-printing a UV ray-curable etching resist in a circuit pattern, curing the printed resist (FIG. 2c), and etching in the same manner as in Example 1. At this stage, a brazing material protruded from the periphery of the circuit pattern (FIG. 2d) was removed by chemical liquor treatment under such conditions as shown in Table 2 to produce a ceramic circuit board. The evaluation results are shown in Table 14.

TABLE 2

| Examples | Mixed amount (parts) | | Coated amount (mg/cm$^2$) | Chemical liquor treatment |
|---|---|---|---|---|
| | Titanium hydride | Aluminum nitride | | |
| 12 | 5 | 0.5 | 12.5 | Hydrofluoric acid (65° C., 30%) 15 minutes |
| 13 | 20 | 1 | 9.0 | Hydrofluoric acid (65° C., 30%) 15 minutes |
| 14 | 25 | 5 | 8.0 | Mixed acid of hydrofluoric acid 25% and hydrochloric acid 15% (65° C.) 20 minutes |
| 15 | 30 | 10 | 10.5 | Mixed acid of hydrofluoric acid 25% and hydrochloric acid 15% (65° C.) 20 minutes |

Note: When mixing a paste, 15 parts of terpinenol was added.

EXAMPLES 16-19

These Examples were carried out in accordance with the steps of FIG. 1a to FIG. 1e.

A brazing paste was prepared by mixing 72 parts of silver powder, 28 parts of copper powder, 9.3 parts of zirconium hydride powder and 15 parts of terpinenol. In the same manner as in Example 1, an aluminum nitride board and a copper plate were bonded by using this paste, and the bonded product was subjected to etching treatment and then chemical liquor treatment to produce a ceramic circuit board. Production conditions are shown in Table 3. The evaluation results are shown in Table 14.

TABLE 3

| Examples | Coated amount (mg/cm$^2$) | Bonding condition | Chemical liquor treatment |
|---|---|---|---|
| 16 | 5.5 | 940° C. 0.5 hr | Hydrofluoric acid (80° C., 30%) 20 minutes |
| 17 | 5.5 | Cooling rate 3° C./min | Hydrofluoric acid (80° C., 30%) 10 minutes |
| 18 | 7.5 | | Hydrofluoric acid (80° C., 30%) 20 minutes |
| 19 | 7.5 | | Hydrofluoric acid (80° C., |

TABLE 3-continued

| Examples | Coated amount (mg/cm$^2$) | Bonding condition | Chemical liquor treatment |
|---|---|---|---|
| | | | 30%) 10 minutes |

EXAMPLE 20

This Example was carried out in accordance with the steps of FIG. 2a to FIG. 2e.

A brazing paste was prepared by mixing 72 parts of silver powder, 28 parts of copper powder, 19 parts of metal zirconium powder and 15 parts of terpinenol in weight ratio. This paste was coated on an aluminum nitride board (coated amount 10.0 mg/cm$^2$) in the same manner as in Example 12, and a solid copper plate (thickness 0.25 mm$^t$) was disposed thereon. The resultant product was subjected to heat treatment to produce a bonded product (bonding conditions: 940° C., 0.5 hour and cooling rate of 3° C./min). Thereafter, this bonded product was treated in the same manner as in Example 12 to produce a ceramic circuit board. The chemical liquor treatment was conducted with 30% hydrofluoric acid at 80° C. for 15 minutes. The evaluation results are shown in Table 14.

EXAMPLES 21-22

These Examples were carried out in accordance with the steps of FIG. 2a to FIG. 2e.

A brazing paste was prepared by mixing 72 parts of silver powder, 28 parts of copper powder, zirconium powder, titanium powder, aluminum oxide powder and aluminum nitride powder in such ratios as shown in Table 4 in weight ratios. By using this paste and an aluminum nitride board, a ceramic circuit board using a copper plate as a metal circuit was produced in the same manner as in Example 12. The production conditions are shown in Table 4. The evaluation results are shown in Table 14.

TABLE 4

| | Mixed amount (parts) | | | | Coated | | |
|---|---|---|---|---|---|---|---|
| Examples | Zirconium | Titanium | Aluminum oxide | Aluminum nitride | amount (mg/cm$^2$) | Bonding condition | Chemical liquor treatment |
| 21 | 5 | 13 | 0.2 | 0 | 8.0 | 950° C. 0.2 hr Cooling rate 3° C./min | Hydrofluoric acid (80° C., 30%) 10 minutes → Sulfuric acid (70° C., 10%) 15 minutes |
| 22 | 5 | 13 | 0 | 5 | 8.0 | | Hydrofluoric acid (80° C., 30%) 10 minutes → Sulfric acid (70° C., 10%) 15 minutes |

Note: A paste was modified by adding 12 parts of terpinenol and 0.5 part of polymethylmethacrylate.

EXAMPLES 23-26

These Examples were carried out in accordance with the steps of FIG. 1a to FIG. 1e.

A paste was prepared by mixing 72 parts of silver powder, 28 parts of copper powder, and titanium hydride powder in such a ratio as shown in Table 5 in weight ratios. By using this paste, an aluminum nitride board, an aluminum oxide board and a copper board of 0.2 mm$^t$ ceramic circuit boards were produced in the same manner as in Example 1 (the paste was coated by screen-printing). The production conditions are shown in Table 5. The evaluation results are shown in Table 14.

TABLE 5

| Examples | Ceramic board | Mixed amount of titanium hydride (parts) | Coated amount (mg/cm$^2$) | Bonding condition | Chemical liquor treatment |
|---|---|---|---|---|---|
| 23 | AlN | 10 | 10.5 | 900° C. 0.5 hr Cooling rate 2° C./min | Hydrofluoric acid (80° C., 30%) 8 minutes, ultrasonic wave applied |
| 24 | AlN | 19 | 7.0 | | Hydrofluoric acid (80° C., 30%) 12 minutes, ultrasonic wave applied |
| 25 | Al$_2$O$_3$ | 5 | 6.0 | | Hydrofluoric acid (80° C., 30%) 5 minutes, ultrasonic wave applied |
| 26 | Al$_2$O$_3$ | 10 | 6.0 | | Hydrofluoric acid (80° C., 30%) 5 minutes, ultrasonic wave applied |

Note: A paste was modified by adding 15 parts of terpinenol.

EXAMPLES 27-28

These Examples were carried out in accordance with the steps of FIG. 1a to FIG. 1e.

A paste was prepared by mixing 15 parts of terpinenol with 100 parts of an alloy powder of copper and titanium (composition: copper 95% by weight, titanium 5% by weight). By using this paste and an aluminum nitride board or an aluminum oxide board and a copper plate (thickness 0.3 mm$^t$) as a metal plate, a ceramic circuit board was prepared in the same manner as in Example 1. The production conditions are shown in Table 6. The evaluation results are shown in Table 14.

TABLE 6

| Examples | Ceramic board | Coated amount (mg/cm$^2$) | Bonding condition | Chemical liquor treatment | |
|---|---|---|---|---|---|
| 27 | AlN | 9.0 | 980° C. 0.5 hr | Hydrofluoric acid (85° C., 10%) 5 minutes | → Ultrasonic wave applied during washing with water |

TABLE 6-continued

| Examples | Ceramic board | Coated amount (mg/cm$^2$) | Bonding condition | Chemical liquor treatment |
|---|---|---|---|---|
| 28 | Al$_2$O$_3$ | 9.0 | Cooling rate 2° C./min | Hydrofluoric acid (85° C., 10%) 5 minutes |

EXAMPLES 29-30

These Examples were carried out in accordance with the steps of FIG. 4a to FIG. 4e.

A brazing paste was prepared by mixing 15 parts by weight of terpinenol with 100 parts by weight of an alloy powder of silver, copper and titanium (composition: silver 72 parts, copper 28 parts and titanium 10 parts in weight ratios). This brazing paste was coated on an aluminum nitride board (Example 29) or an alumina board (Example 30) of 70 mm×40 mm×0.635 mm$^t$ in a bonding pattern by screen-printing (FIG. 4a). After sufficiently drying the coated board, a push back copper plate having the same size as the board and having a thickness of 0.2 mm, the circuit part of which was struck by a press and returned to unite with the metal parts other than the circuit part, was disposed on the dried board in contact therewith in such a manner as to have the bonding pattern and the metal circuit pattern coincided, and the resultant product was heated at 880° C. for 0.5 hour in a highly vacuumed atmosphere to produce five sheets each of a bonded product (FIG. 4b).

Thereafter, a metal circuit was formed by mechanically separating the parts other than the metal circuit from the bonded product (FIGS. 4c, d). At this stage, a brazing material was protruded from the periphery of the metal circuit (FIG. 4d), and the protruded brazing material was removed with 10% hydrofluoric acid at 70° C. for 30 minutes in Example 29 and for 10 minutes in Example 30. The evaluation results of the ceramic circuit boards thus obtained are shown in Table 14.

EXAMPLES 31-34

These Examples were carried out in accordance with the steps of FIG. 3a to FIG. 3e.

A brazing paste was prepared by mixing 100 parts by weight of an alloy powder of copper and zirconium (composition: silver 95 parts and zirconium 5 parts in weight ratios), 15 parts by weight of terpinenol and 1 part by weight of polymethylmethacrylate. This paste was coated respectively on an aluminum nitride board (Example 31) a mullite board (Example 32), an aluminum oxide board (Example 33) and a silicon nitride board (Example 34) by screen printing in a bonding pattern (the coated amount 7.0 mg/cm$^2$) (FIG. 3a).

After sufficiently drying this board, a half-etched copper plate having the same size as the board, which was previously modified by etching so as to have a metal circuit part of 0.3 mm$^t$ and a part other the metal circuit of 0.2 mm$^t$, was disposed on the dried board in contact therewith in such a manner as to have the paste part and the circuit part of the half-etched copper plate coincided, and the resultant product was heat-treated at 980° C. for 0.5 hour in a highly vacuumed atmosphere to produce a bonded product (FIG. 3b).

Thereafter, a UV ray-curable etching resist was coated on the copper plate of the bonded product by a roll coater (FIG. 3c, the resist being deposited on the circuit part only), and the board thus coated was subjected to etching treatment in the same manner as in Example 1 to produce a metal circuit pattern. At this stage, an unnecessary brazing material protruded from the metal circuit pattern was removed by treating with a mixed acid of 20% hydrofluoric acid and 10% nitric acid at 65° C. for 5 minutes while applying ultrasonic wave.

The performance of the ceramic circuit board thus obtained was evaluated and the results are shown in Table 14.

EXAMPLES 35-36

These Examples were carried out in accordance with the steps of FIG. 1a to FIG. 1e.

A paste was prepared by mixing 100 parts by weight of an alloy powder of silver, copper and zirconium (alloy composition being shown in Table 7), 12 parts by weight of terpinenol and 1 part by weight of polyisobutyl methacrylate. A ceramic circuit board was produced in the same manner as in Example 1 by using this paste, an aluminum nitride board and a copper plate (thickness 0.2 mm). The production conditions are shown in Table 7. The evaluation results are shown in Table 14.

TABLE 7

| Examples | Composition of Alloy (parts by weight) | | | Coated amount (mg/cm$^2$) | Bonding condition | Chemical liquor treatment | |
|---|---|---|---|---|---|---|---|
| | Silver | Copper | Zirconium | | | | |
| 35 | 72 | 28 | 5 | 11.0 | 920° C. 0.3 hr Cooling rate 2° C./min | Hydrofluoric acid (80° C., 15%) 3 minutes | → Ultrasonic wave applied during washing with water |
| 36 | 72 | 28 | 20 | 8.0 | | Hydrofluoric acid (80° C., 15%) 6 minutes | → Ultrasonic wave applied during washing with water |

EXAMPLE 37

This Example was carried out in accordance with the steps of FIG. 1a to FIG. 1e.

A paste was prepared by mixing 100 parts by weight an alloy powder of nickel and titanium (alloy composition being shown in Table 8) and 15 parts by weight of terpinenol. A ceramic circuit board was produced in the same manner as in Example 1 by using this paste, an aluminum nitride board and a nickel plate (thickness 0.2 mm) (the paste was printed by screen-printing). The production conditions are shown in Table 8. The evaluation results are shown in Table 14.

nitride board of 65 mm×45 mm×0.635 mm$^t$, laminating a solid copper plate of 0.25 mm$^t$ thereon and heat-

TABLE 8

| Examples | Composition of Alloy (parts by weight) Nickel | Titanium | Coated amount (mg/cm$^2$) | Bonding condition | Chemical liquor treatment |
|---|---|---|---|---|---|
| 37 | 60 | 40 | 7.0 | 1150° C. 0.5 hr Temperature-descending speed 2° C./min | Sodium hydroxide solution (45° C., 20%) 5 minutes |

EXAMPLES 38–39

These Examples were carried out in accordance with the steps of FIG. 2a to FIG. 2e.

A paste was prepared by mixing 60 parts of nickel powder, 40 parts of titanium hydride powder and 12 parts of terpinenol in weight ratios. A ceramic circuit board was produced in the same manner as in Example 12 by using this paste, and an aluminum oxide board (Example 38) or a silicon nitride board (Example 39), and an Ni alloy plate (Ni: 80 wt %, Cu 20 wt %, thickness 0.35 mm) as a metal plate. The production conditions are shown in Table 9. The evaluation results are shown in Table 14.

TABLE 9

| Examples | Ceramic board | Coated amount (mg/cm$^2$) | Bonding condition | Chemical liquor treatment |
|---|---|---|---|---|
| 38 | Al$_2$O$_3$ | 8.0 | 1180° C. 0.3 hr Temperature-descending speed 2° C./min | Potassium hydroxide solution (50° C., 15%) 5 minutes |
| 39 | Si$_3$N$_4$ | 8.0 | | Potassium hydroxide solution (50° C., 15%) 5 minutes |

EXAMPLES 40–42

These Examples were carried out in accordance with the steps of FIG. 1a to FIG. 1e.

A bonded product was produced by disposing an alloy foil having the composition and thickness shown in Table 10 on the whole surface area of an aluminum nitride board of 65 mm×45 mm×0.635 mm$^t$, laminating a solid copper plate of 0.25 mm$^t$ thereon and heat-treating at 920° C. for 0.5 hour in a highly vacuumed atmosphere.

Thereafter, the bonded product was subjected to etching treatment in the same manner as in Example 1 to form a metal circuit pattern, and an unnecessary brazing material was then removed as shown in Table 10 to produce a ceramic circuit board. The evaluation results are shown in Table 14.

TABLE 10

| Examples | Composition of Alloy (parts by weight) Silver | Copper | Zirconium | Thickness of alloy foil (μm) | Chemical liquor treatment | |
|---|---|---|---|---|---|---|
| 40 | 72 | 28 | 5 | 10 | Hydrofluoric acid → (80° C., 10%) 4 minutes | Ultrasonic wave applied during washing with water |
| 41 | 72 | 28 | 10 | 10 | Hydrofluoric acid → (800° C., 10%) 6 minutes | Ultrasonic wave applied during washing with water |
| 42 | 72 | 28 | 30 | 9 | Hydrofluoric acid → (800 C., 10%) 7 minutes | Ultrasonic wave applied during washing with water |

EXAMPLES 43–44

These Examples were carried out in accordance with the steps of FIG. 4a to FIG. 4e.

A ceramic circuit board was produced by disposing an alloy foil having the composition and thickness shown in Table 11 on an aluminum nitride board or an aluminum oxide board having the same shape as in Example 40 in a bonding pattern, laminating a push back copper plate of a thickness of 0.25 mm thereon and subjecting to the same steps as in Example 29. The production conditions are shown in Table 11. The evaluation results are shown in Table 14.

TABLE 11

| Examples | Ceramic board | Composition of Alloy (parts by weight) Silver | Copper | Titanium | Thickness of alloy foil (μm) | Bonding condition | Chemical liquor treatment |
|---|---|---|---|---|---|---|---|
| 43 | AlN | 72 | 28 | 15 | 9 | 900° C. 0.2 hr | Hydrofluoric acid (70° C., 10%) 30 minutes |
| 44 | Al$_2$O$_3$ | 72 | 28 | 5 | 9 | Temperature-descending speed | Hydrofluoric acid (70° C., 10%) 10 minutes |

TABLE 11-continued

| Examples | Ceramic board | Composition of Alloy (parts by weight) | | | Thickness of alloy foil (μm) | Bonding condition | Chemical liquor treatment |
|---|---|---|---|---|---|---|---|
| | | Silver | Copper | Titanium | | | |
| | | | | | | 2° C./min | |

EXAMPLES 45-46

These Examples were carried out in accordance with the steps of FIG. 2a to FIG. 2e.

A ceramic circuit board was produced by using an alloy foil and a metal plate shown in Table 12. The alloy foil was disposed on an aluminum nitride board in a bonding pattern. The production conditions are shown in Table 12. The evaluation results are shown in Table 14.

TABLE 12

| Examples | Metal plate | Composition of Alloy (parts by weight) | | | Thickness of alloy foil (μm) | Bonding condition | Chemical liquor treatment |
|---|---|---|---|---|---|---|---|
| | | Copper | Nickel | Titanium | | | |
| 45 | Copper alloy plate (Cu 80 wt %, Ni 20 wt %) | 95 | 0 | 5 | 15 | 980° C. 0.3 hr Temperature-descending speed 2° C./min | Sodium hydroxide solution (45° C., 20%) 5 minutes |
| 46 | Nickel alloy Plate (Ni 80 wt %, Cu 20 wt %) | 0 | 60 | 40 | 9 | 1150° C. 0.5 hr Temperature-desending speed 2° C./min | Aqua regia (55° C., 30%) 3 minutes |

EXAMPLES 47-48

A bonded product was produced by laminating firstly a zirconium foil and secondly an alloy foil of silver and copper (composition ratio: silver 72 parts and copper 28 parts in weight ratios) on the whole surface area of an aluminum nitride board of 60 mm×40 mm×0.65 mm$^t$, disposing a copper plate of 0.3 mm$^t$ having the same shape as the laminated board and heat-treating at 940° C. for 0.3 hour in a highly vacuumed atmosphere. The thickness of each foil is shown in Table 13.

TABLE 13

| Examples | Thickness of zirconium foil (μm) | Thickness of silver/copper alloy foil |
|---|---|---|
| 47 | 2 | 11 |
| 48 | 4 | 7 |

Thereafter, this bonded product was treated in the same manner as in Example 1 to form a metal circuit pattern, and an unnecessary brazing material was removed with 10% hydrofluoric acid at 80° C. for 5 minutes in Example 47 and for 7 minutes in Example 48 while applying ultrasonic wave to produce a ceramic circuit board. The evaluation results are shown in Table 14.

EXAMPLES 49-50

These Example were carried out in accordance with the steps of FIG. 3a to FIG. 3e.

A bonded product was produced by laminating firstly a titanium foil (thickness 2 μm) and secondly an alloy foil of silver and copper (the same composition as in Example 47, thickness 6 μm) on an aluminum nitride board (Example 49) or an alumina board (Example 50) in a bonding pattern, disposing a half-etched copper plate having the same size as the board, the circuit part of which has a thickness of 0.3 mm, on the laminated board in such a manner as to have the foil and the copper circuit part coincided, and heat-treating at 880° C. for 0.5 hour in a highly vacuumed atmosphere. Thereafter, the bonded product was treated in the same manner as in Example 31 to form a metal circuit pattern, and a protruded brazing material was removed by treating with a mixed acid of 15% hydrofluoric acid and 20% hydrochloric acid at 70° C. for 30 minutes in Example 49 and for 5 minutes in Example 50. The evaluation results of the ceramic circuit board thus obtained are shown in Table 14.

TABLE 14

| Examples | Type of Ceramic board | Metal plate | Soldering material for bonding | | | Chemical liquor treatment | | Peeling strength (1 sheet, 1 point, total 5 points, kg/cm) | | |
|---|---|---|---|---|---|---|---|---|---|---|
| | | | Form of soldering material and disposition | Type of soldering material and composition (parts by weight) | Coated amount of paste (mg/cm$^2$) | | | Average | Minimum | Maximum |
| 1 | AlN | Solid Cu plate | Paste (mixture) disposed on whole surface | Ag/Cu/Zr 72/28/4 | 12.0 | Hydrofluoric acid (80° C., 10%) 8 minutes | | 7.1 | 6.5 | 7.7 |
| 2 | AlN | Solid Cu plate | Paste (mixture) disposed on whole surface | Ag/Cu/Zr 72/28/4 | 12.0 | Hydrofluoric acid (80° C., 10%) 4 minutes | Ultrasonic wave applied during washing with water | 7.2 | 6.4 | 7.9 |
| 3 | AlN | Solid | Paste (mix- | Ag/Cu/Zr | 7.5 | Hydrofluoric acid (80° C., 10%) 12 | | 8.6 | 7.6 | 9.8 |

TABLE 14-continued

| Examples | Type of Ceramic board | Metal plate | Soldering material for bonding | | | Chemical liquor treatment | Peeling strength (1 sheet, 1 point, total 5 points, kg/cm) | | |
|---|---|---|---|---|---|---|---|---|---|
| | | | Form of soldering material and disposition | Type of soldering material and composition (parts by weight) | Coated amount of paste (mg/cm²) | | Average | Minimum | Maximum |
| | | Cu plate | ture) disposed on whole surface | 72/28/20 | | minutes | | | |
| 4 | AlN | Solid Cu plate | Paste (mixture) disposed on whole surface | Ag/Cu/Zr 72/28/20 | 7.5 | Hydrofluoric acid (80° C., 10%) 6 minutes → Ultasonic wave applied during washing with water | 8.7 | 7.5 | 10.0 |
| 5 | AlN | Solid Cu plate | Paste (mixture) disposed on whole surface | Ag/Cu/Zr 72/28/35 | 5.5 | Hydrofluoric acid (80° C., 10%) 14 minutes | 7.8 | 6.9 | 9.0 |
| 6 | AlN | Solid Cu plate | Paste (mixture) disposed on whole surface | Ag/Cu/Zr 72/28/35 | 5.5 | Hydrofluoric acid (80° C., 10%) 7 minutes → Ultrasonic wave applied during washing with water | 7.7 | 7.2 | 8.9 |
| 7 | AlN | Solid Cu plate | Paste (mixture) disposed on whole surface | Ag/Cu/Zr/TiH$_2$ 72/28/2/25 | 6.0 | Hydrofluoric acid (70° C., 15%) Ultrasonic wave applied 10 minutes → Hydrochloric acid (55° C., 10%) 15 minutes | 11.2 | 9.4 | 12.3 |
| 8 | AlN | Solid Cu plate | Paste (mixture) disposed on whole surface | Ag/Cu/Zr/TiH$_2$ 72/28/2/2 | 8.0 | Hydrofluoric acid (70° C., 15%) Ultrasonic wave applied 5 minutes → Hydrochloric acid (55° C., 10%) 15 minutes | 6.6 | 6.1 | 7.1 |
| 9 | AlN | Solid Cu plate | Paste (mixture) disposed on whole surface | Ag/Cu/Zr/TiH$_2$ 72/28/25/1 | 7.5 | Hydrofluoric acid (70° C., 15%) Ultrasonic wave applied 5 minutes → Hydrochloric acid (55° C., 10%) 15 minutes | 9.8 | 8.8 | 11.0 |
| 10 | AlN | Solid Cu plate | Paste (mixture) disposed on whole surface | Ag/Cu/Zr/TiH$_2$ 72/28/25/10 | 5.5 | Hydrofluoric acid (70° C., 15%) Ultrasonic wave applied 10 minutes → Hydrochloric acid (55° C., 10%) 15 minutes | 10.4 | 9.5 | 11.3 |
| 11 | AlN | Solid Cu plate | Paste (mixture) disposed on whole surface | Ag/Cu/Zr/TiH$_2$ 72/28/13/5 | 8.0 | Hydrofluoric acid (70° C., 15%) Ultrasonic wave applied 5 minutes → Hydrochloric acid (55° C., 10%) 15 minutes | 11.5 | 9.3 | 12.5 |
| 12 | AlN | Solid Cu plate | Paste (mixture) disposed in bonding pattern | Ag/Cu/TiH$_2$/AlN 72/28/5/0.5 | 12.5 | Hydrofluoric acid (65° C., 30%) 15 minutes | 7.6 | 7.2 | 8.1 |
| 13 | AlN | Solid Cu plate | Paste (mixture) disposed in bonding pattern | Ag/Cu/TiH$_2$/AlN 72/28/20/1 | 9.0 | Hydrofluoric acid (65° C., 30%) 15 minutes | 11.4 | 10.7 | 12.2 |
| 14 | AlN | Solid Cu plate | Paste (mixture) disposed in bonding pattern | Ag/Cu/TiH$_2$/AlN 72/28/25/5 | 8.0 | Mixed acid of hydrofluoric acid 25% and hydrochloric acid 15% (65° C.) 20 minutes | 10.8 | 9.9 | 11.5 |
| 15 | AlN | Solid Cu plate | Paste (mixture) disposed in bonding pattern | Ag/Cu/TiH$_2$/AlN 72/28/30/10 | 8.0 | Mixed acid of hydrofluoric acid 25% and hydrochloric acid 15% (65° C.) 20 minutes | 8.9 | 8.5 | 9.4 |
| 16 | AlN | Solid Cu plate | Paste (mixture) disposed on whole surface | Ag/Cu/ZrH$_2$ 72/28/9.3 | 5.5 | Hydrofluoric acid (80° C., 30%) 20 minutes | 6.5 | 6.0 | 7.1 |
| 17 | AlN | Solid Cu plate | Paste (mixture) disposed on whole surface | Ag/Cu/ZrH$_2$ 72/28/9.3 | 5.5 | Hydrofluoric acid (80° C., 30%) 10 minutes | 7.0 | 6.4 | 7.5 |
| 18 | AlN | Solid Cu plate | Paste (mixture) disposed on whole surface | Ag/Cu/ZrH$_2$ 72/28/9.3 | 7.5 | Hydrofluoric acid (80° C., 30%) 20 minutes | 7.5 | 6.9 | 8.2 |
| 19 | AlN | Solid Cu plate | Paste (mixture) disposed on whole surface | Ag/Cu/ZrH$_2$ 72/28/9.3 | 7.5 | Hydrofluoric acid (80° C., 30%) 10 minutes | 8.1 | 7.3 | 8.6 |
| 20 | AlN | Solid Cu | Paste (mixture) disposed | Ag/Cu/Zr 72/28/19 | 10.0 | Hydrofluoric acid (80° C., 30%) 15 minutes | 8.0 | 7.1 | 8.8 |

TABLE 14-continued

| Examples | Type of Ceramic board | Metal plate | Soldering material for bonding | | | Chemical liquor treatment | Peeling strength (1 sheet, 1 point, total 5 points, kg/cm) | | |
| | | | Form of soldering material and disposition | Type of soldering material and composition (parts by weight) | Coated amount of paste (mg/cm²) | | Average | Minimum | Maximum |
|---|---|---|---|---|---|---|---|---|---|
| | | plate | in bonding pattern | | | | | | |
| 21 | AlN | Solid Cu plate | Paste (mixture) disposed in bonding pattern | Ag/Cu/Zr/Ti/ Al$_2$O$_3$ 72/28/5/13/0.2 | 8.0 | Hydrofluoric acid (80° C., 30%) 10 minutes → sulfuric acid (70° C. 10%) 15 minutes | 8.2 | 7.5 | 9.2 |
| 22 | AlN | Solid Cu plate | Paste (mixture) disposed in bonding pattern | Ag/Cu/Zr/Ti/ AlN 72/28/5/13/5 | 8.0 | Hydrofluoric acid (80° C., 30%) 10 minutes → sulfuric acid (70° C. 10%) 15 minutes | 8.4 | 7.9 | 9.6 |
| 23 | AlN | Solid Cu plate | Paste (mixture) disposed on whole surface | Ag/Cu/TiH$_2$ 72/28/10 | 10.5 | Hydrofluoric acid (80° C., 30%) 8 minutes ultrasonic wave applied | 8.3 | 8.9 | 7.8 |
| 24 | AlN | Solid Cu plate | Paste (mixture) disposed on whole surface | Ag/Cu/TiH$_2$ 72/28/19 | 7.0 | Hydrofluoric acid (80° C., 30%) 12 minutes, ultrasonic wave applied | 11.8 | 10.8 | 13.0 |
| 25 | Al$_2$O$_3$ | Solid Cu plate | Paste (mixture) disposed on whole surface | Ag/Cu/TiH$_2$ 72/28/5 | 6.0 | Hydrofluoric acid (80° C., 30%) 5 minutes, ultrasonic wave applied | 12.0 | 10.5 | 14.1 |
| 26 | Al$_2$O$_3$ | Solid Cu plate | Paste (mixture) disposed on whole surface | Ag/Cu/TiH$_2$ 72/28/10 | 6.0 | Hydrofluoric acid (80° C., 30%) 5 minutes, ultrasonic wave applied | 9.2 | 8.0 | 10.3 |
| 27 | AlN | Solid Cu plate | Paste (alloy) disposed on whole surface | Cu/Ti 95/5 | 9.0 | Hydrofluoric acid (85° C., 10%) 5 minutes → Ultrasonic wave applied during washing with water | 5.9 | 5.1 | 6.5 |
| 28 | Al$_2$O$_3$ | Solid Cu plate | Paste (alloy) disposed on whole surface | Cu/Ti 95/5 | 9.0 | Hydrofluoric acid (85° C., 10%) 5 minutes | 7.0 | 6.1 | 8.0 |
| 29 | AlN | Push back Cu plate | Paste (alloy) disposed in bonding pattern | Ag/Cu/Ti 72/28/10 | 6.0 | Hydrofluoric acid (70° C., 10%) 30 minutes | 6.1 | 5.5 | 7.0 |
| 30 | Al$_2$O$_3$ | Push back Cu plate | Paste (alloy) disposed in bonding pattern | Ag/Cu/Ti 72/28/10 | 6.0 | Hydrofluoric acid (70° C., 10%) 10 minutes | 9.3 | 8.1 | 10.5 |
| 31 | AlN | Half-etched Cu plate | Paste (alloy) disposed in bonding pattern | Cu/Zr 95/5 | 7.0 | Mixed acid of hydrofluoric acid 20% and nitric acid 10% (65° C.) 5 minutes, ultrasonic wave applied | 6.2 | 5.5 | 7.0 |
| 32 | Mullite | Half-etched Cu plate | Paste (alloy) disposed in bonding pattern | Cu/Zr 95/5 | 7.0 | Mixed acid of hydrofluoric acid 20% and nitric acid 10% (65° C.) 5 minutes, ultrasonic wave applied | 6.4 | 5.9 | 7.3 |
| 33 | Al$_2$O$_3$ | Half-etched Cu plate | Paste (alloy) disposed in bonding pattern | Cu/Zr 95/5 | 7.0 | Mixed acid of hydrofluoric acid 20% and nitric acid 10% (65° C.) 5 minutes, ultrasonic wave applied | 7.9 | 7.3 | 8.5 |
| 34 | Si$_3$N$_4$ | Half-etched Cu plate | Paste (alloy) disposed in bonding pattern | Cu/Zr 95/5 | 7.0 | Mixed acid of hydrofluoric acid 20% and nitric acid 10% (65° C.) 5 minutes ultrasonic wave applied | 6.1 | 5.2 | 7.3 |
| 35 | AlN | Solid Cu plate | Paste (alloy) disposed on whole surface | Al/Cu/Zr 72/28/5 | 11.0 | Hydrofluoric acid (80° C., 15%) 3 minutes → Ultrasonic wave applied during washing with water | 7.1 | 6.4 | 7.9 |
| 36 | AlN | Solid Cu plate | Paste (alloy) disposed | Al/Cu/Zr 72/28/20 | 8.0 | Hydrofluoric acid (80° C., 15%) 6 minutes → Ultrasonic wave applied during washing | 8.3 | 7.3 | 9.5 |

TABLE 14-continued

| | | | Soldering material for bonding | | | | Peeling strength (1 sheet, 1 point, total 5 points, kg/cm) | | |
|---|---|---|---|---|---|---|---|---|---|
| Examples | Type of Ceramic board | Metal plate | Form of soldering material and disposition | Type of soldering material and composition (parts by weight) | Coated amount of paste (mg/cm$^2$) | Chemical liquor treatment | Average | Minimum | Maximum |
| 37 | AlN | Solid Ni plate | Paste (alloy) disposed in bonding pattern | Ni/Ti 60/40 | 7.0 | NaOH (45° C., 20%) 5 minutes | 6.1 | 5.3 | 7.2 |
| 38 | Al$_2$O$_3$ | Solid Ni plate | Paste (mixture) disposed in bonding pattern | Ni/TiH$_2$ 60/40 | 8.0 | KOH (50° C., 15%) 5 minutes | 6.0 | 5.1 | 6.8 |
| 39 | Si$_3$N$_4$ | Solid Ni alloy plate | Paste (mixture) disposed in bonding pattern | Ni/TiH$_2$ 60/40 | 8.0 | KOH (50° C., 10%) 10 minutes | 5.8 | 5.0 | 6.5 |
| 40 | AlN | Solid Cu plate | Alloy foil disposed on whole surface | Ag/Cu/Zr 72/28/5 | 10 | Hydrofluoric acid (80° C., 10%) 4 minutes → Ultrasonic wave applied during washing with water | 7.3 | 6.8 | 8.0 |
| 41 | AlN | Solid Cu plate | Alloy foil disposed on whole surface | Ag/Cu/Zr 72/28/10 | 10 | Hydrofluoric acid (80° C., 10%) 6 minutes → Ultrasonic wave applied during washing with water | 8.0 | 7.5 | 8.6 |
| 42 | AlN | Solid Cu plate | Alloy foil disposed on whole surface | Ag/Cu/Zr 72/28/30 | 9 | Hydrofluoric acid (80° C., 10%) 7 minutes → Ultrasonic wave applied during washing with water | 7.6 | 6.9 | 8.2 |
| 43 | AlN | Push back Cu plate | Alloy foil disposed in bonding pattern | Ag/Cu/Ti 72/28/15 | 9 | Hydrofluoric acid (70° C., 10%) 30 minutes | 7.1 | 6.5 | 8.0 |
| 44 | Al$_2$O$_3$ | Push back Cu plate | Alloy foil disposed in bonding pattern | Ag/Cu/Ti 72/28/5 | 9 | Hydrofluoric acid (70° C., 10%) 10 minutes | 9.0 | 7.7 | 10.2 |
| 45 | AlN | Solid cu alloy plate | Alloy foil disposed in bonding pattern | Cu/Ti 95/5 | 15 | NaOH (45° C., 20%) 5 minutes | 5.9 | 6.5 | 5.0 |
| 46 | AlN | Solid Ni alloy plate | Alloy foil disposed in bonding pattern | Ni/Ti 60/40 | 9 | Aqua regia (55° C., 30%) 3 minutes | 5.8 | 6.3 | 5.2 |
| 47 | AlN | Solid Cu plate | Laminate of Ag/Cu alloy foil and Zr foil disposed on whole surface | Ag/Cu/Zr — | Ag/Cu: 11 μm, Zr: 2 μm | Hydrofluoric acid (80° C., 10%) 5 minutes, ultrasonic wave applied | 8.1 | 7.6 | 8.5 |
| 48 | AlN | Solid Cu plate | Laminate of Ag/Cu alloy foil and Zr foil disposed on whole surface | Ag/Cu/Zr — | Ag/Cu: 7 μm, Zr: 4 μm | Hydrofluoric acid (80° C., 10%) 7 minutes, ultrasonic wave applied | 7.7 | 7.1 | 8.8 |
| 49 | AlN | Half-etched Cu plate | Laminate of Ag/Cu alloy foil and Ti foil disposed on whole surface | Ag/Cu/Ti — | Ag/Cu: 6 μm Ti: 2 μm | Mixed acid of hydrofluoric acid (15%) and hydrochloric acid (20%) (70° C.) 30 minutes | 7.0 | 6.6 | 7.9 |
| 50 | Al$_2$O$_3$ | Half-etched Cu plate | Laminate of Ag/Cu alloy foil and Ti foil disposed in bonding pattern | Ag/Cu/Ti — | Ag/Cu: 6 μm, Ti: 2 μm | Mixed acid of hydrofluoric acid (15%) and hydrochloric acid (20%) (70° C.) 5 minutes | 9.0 | 7.7 | 10.0 |

*It was not recognized that any soldering material ingredient remained between patterns in any of the Examples.

We claim:

1. A method for forming a ceramic circuit board, comprising forming a metal circuit pattern on a ceramic board by means of an active metal ingredient-containing brazing material and removing an unnecessary part of the brazing material by chemical liquor treatment.

2. The method according to claim 1, wherein the metal ingredient of the active metal ingredient-containing brazing material includes a copper ingredient and a zirconium ingredient as an active metal ingredient.

3. The method according to claim 1, wherein the metal ingredient of the active metal ingredient-containing brazing material comprises a copper ingredient and an active metal ingredient including a titanium ingredient and/or a hafnium ingredient.

4. The method according to claim 2, wherein the active metal ingredient-containing brazing material further contains a silver ingredient.

5. The method according to claim 3, wherein the active metal ingredient-containing brazing material further contains a silver ingredient.

6. The method according to claim 1, wherein the metal ingredient of the active metal ingredient-containing brazing material comprises a nickel ingredient and an active metal ingredient including one or two or more members selected from the group consisting of a titanium ingredient, a zirconium ingredient and a hafnium ingredient.

7. The method according to claim 1, wherein the active metal ingredient-containing brazing material is used as a paste.

8. The method according to claim 7, wherein the metal ingredient of the active metal ingredient-containing brazing material is provided in the form of a metal powder, an alloy powder and/or a compound of a metal.

9. The method according to claim 8, wherein the active metal ingredient-containing brazing material further contains one or two or more ceramic powders selected from the group consisting of aluminum nitride, silicon nitride, aluminum oxide and boron nitride.

10. The method according to claim 1, wherein the active metal ingredient-containing brazing material is used in the form of a foil.

11. The method according to claim 10, wherein the foil is an alloy foil comprising an active metal ingredient and a metal ingredient other than the active metal ingredient.

12. The method according to claim 10, wherein the foil is a laminated foil comprising an active metal foil and a metal foil other than the active metal foil.

13. The method according to claim 7, wherein the active metal ingredient-containing brazing material paste is coated on a ceramic board in an area at least covering a metal circuit pattern to be formed thereon.

14. The method according to claim 7, wherein the active metal ingredient-containing brazing material paste is coated on a ceramic board in the same shape as a metal circuit pattern.

15. The method according to claim 7, wherein the active metal ingredient-containing brazing material foil is disposed on a ceramic board in an area at least covering a metal circuit pattern formed thereon.

16. The method according to claim 10, wherein the active metal ingredient-containing brazing material foil is disposed on a ceramic board in the same shape as a metal circuit pattern.

17. The method according to claim 1, wherein the material of the metal circuit pattern comprises one or two or more members selected from the group consisting of copper, nickel, a copper alloy and a nickel alloy.

18. The method according to claim 17, wherein the metal circuit pattern is formed by etching a solid metal plate.

19. The method according to claim 17, wherein the metal circuit pattern is formed by etching a half-etched metal plate.

20. The method according to claim 17, wherein the metal circuit pattern is formed by using a push back metal plate.

21. The method according to claim 1, wherein the material of the ceramic board comprises one or two or more members selected from the group consisting of aluminum nitride, silicon nitride, aluminum oxide and mullite.

22. The method according to claim 1, wherein the chemical liquor to remove the unnecessary part of the brazing material is hydrofluoric acid alone or a mixed acid of hydrofluoric acid and at least one inorganic acid selected from the group consisting of nitric acid, sulfuric acid and hydrochloric acid.

23. The method according to claim 1, wherein the chemical liquor to remove the unnecessary part of the brazing material is aqua regia.

24. The method according to claim 1, wherein the chemical liquor to remove the unnecessary part of the brazing material is a sodium hydroxide solution and/or a potassium hydroxide solution.

25. The method according to claim 1, wherein ultrasonic wave is applied at the same time as the chemical liquor treatment to remove the unnecessary part of the brazing material and/or a cleaning step after the chemical liquor treatment.

* * * * *

UNITED STATES PATENT AND TRADEMARK OFFICE
CERTIFICATE OF CORRECTION

PATENT NO. : 5,354,415
DATED : October 11, 1994
INVENTOR(S) : Yasuhito FUSHII, et al.

It is certified that error appears in the above-indentified patent and that said Letters Patent is hereby corrected as shown below:

On the title page, Item [63] and Column 1, Lines 6 and 7, the PCT Information has been omitted and should read as follows:

--Continuation of Ser. No. 778,211, Dec. 16, 1991, abandoned, filed as PCT/JP90/01502, Nov. 16, 1990--

Signed and Sealed this

Eleventh Day of April, 1995

Attest:

BRUCE LEHMAN

*Attesting Officer*          *Commissioner of Patents and Trademarks*